United States Patent [19]
Zhu et al.

[11] Patent Number: 5,838,607
[45] Date of Patent: Nov. 17, 1998

[54] SPIN POLARIZED APPARATUS

[75] Inventors: Xiaodong T. Zhu, Chandler; Saied N. Tehrani, Tempe; Eugene Chen, Gilbert; Mark Durlam, Chandler, all of Ariz.

[73] Assignee: Motorola, Inc., Schaumburg, Ill.

[21] Appl. No.: 723,162

[22] Filed: Sep. 25, 1996

[51] Int. Cl.$^6$ .......................... G11C 11/00; H01L 29/161
[52] U.S. Cl. ............................ 365/158; 365/66; 365/121; 365/157; 257/11
[58] Field of Search .................... 365/158, 121, 365/66, 157; 250/423 P; 257/11

[56] References Cited

U.S. PATENT DOCUMENTS

| | | | |
|---|---|---|---|
| 4,246,474 | 1/1981 | Lazzari | 365/158 |
| 5,311,474 | 5/1994 | Urban | 365/122 |
| 5,315,127 | 5/1994 | Nakanishi et al. | 257/190 |
| 5,541,888 | 7/1996 | Russell | 365/64 |

*Primary Examiner*—Son T. Dinh
*Attorney, Agent, or Firm*—Eugene A. Parsons

[57] ABSTRACT

Spin polarized apparatus includes a spin polarizing section of magnetic material with an electron input port and a polarized electron port and a transport section of magnetic material with a polarized electron input port electrically coupled to the polarized electron port of the polarizing section and an electron output port. Electrons traversing the polarizing section all have similar spin directions at the output dependent upon the magnetization direction of the polarizing section. Electrons traversing the transport section all have spins in a first direction at the output. The cell has a low resistance when the magnetization direction of the polarizing section is in the first direction (electrons entering the transport section all have spins in the first direction) and a high resistance when the magnetization direction is in an opposite direction (electrons entering the transport section all have spins in the opposite direction).

36 Claims, 3 Drawing Sheets

LOW R →→→ HIGH R

SPIN POLARIZED APPARATUS

FIELD OF THE INVENTION

The present invention pertains to magnetic memory cells and more specifically to magnetic memory cells with higher GMR ratios.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials and utilizes submicron widths, in order to increase density. A conductive layer is disposed between the multi-layers of giant magnetoresistive material. In this structure the magnetization vectors are parallel to the length of the magnetic material instead of the width. In one embodiment the magnetization vector of one magnetic material layer is always maintained in one direction while the magnetization vector of the second magnetic layer switches between parallel and antiparallel to the first vector in order to represent both logical "0" and "1" states. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

A magnetic random access memory (MRAM) is a non-volatile memory which basically includes a giant magnetoresistive (GMR) material, a sense line, and a word line. The MRAM employs the GMR effect to store memory states. Magnetic vectors in one or all of the layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. In this type of device the sense current passes through the cell along the longitudinal axis. The states stored in the GMR material can be read by a sense line. That is, the magnetic vectors in the GMR material cause a different voltage in the sense line because of a different magneto-resistance due to the direction of the magnetic vectors.

In all prior art magnetic random access memories, the GMR ratio is relatively low, which increases the required sensitivity of apparatus utilized to sense (read) the stored state of such a memory cell. Further, these prior art cells generally require relatively high currents to create a magnetic field sufficient to switch, or write, a state in the memory cell. Also, reading or sensing the stored state in these prior art memory cells requires relatively large sense current and/or additional steps to complete the reading or sensing process. Finally, these prior art cells generally include several different layers of magnetic and nonmagnetic material which can, in some embodiments, substantially increase the complexity of manufacturing the memories.

Accordingly, it is highly desirable to provide magnetic random access memories and memory cells with a relatively high GMR ratio, which require low sensing and writing currents, and which are simpler to manufacture and easier to utilize.

It is a purpose of the present invention to provide new and improved spin polarized apparatus.

It is another purpose of the present invention to provide new and improved spin polarized apparatus including an array of improved spin polarized memory cells.

It is still another purpose of the present invention to provide new and improved spin polarized apparatus which produces a larger change (GMR ratio) between states and which utilizes less sensing and writing current.

It is a further purpose of the present invention to provide new and improved spin polarized apparatus which is simpler to manufacture and to use.

It is still a further purpose of the present invention to provide a new and improved multi-state, magnetic memory cell in which it is faster and simpler to sense stored states and to write or store states.

SUMMARY OF THE INVENTION

The above problems and others are at least partially solved and the above purposes and others are realized in a spin polarized apparatus including a spin polarizing section of magnetic material and a transport section of magnetic material. The spin polarizing section has an electron input port and a polarized electron port spaced apart and defining a spin polarizing section length therebetween. The spin polarizing section is magnetized in either a first or an opposite magnetization direction along the length and is constructed such that electrons entering the electron input port exit through the polarized electron port all having similar spin directions dependent upon the magnetization direction of the spin polarizing section.

The transport section has a polarized electron input port electrically coupled to the polarized electron port of the spin polarizing section and an electron output port spaced apart and defining a transport section length therebetween. The transport section is magnetized in the first direction and is constructed such that electrons entering the polarized electron input port exit through the electron output port all having spin directions in the first direction.

In operation, a desired state is written in the cell by energizing a word line, for example, to switch the magnetization direction of the spin polarizing section to a selected one of the first direction and the opposite direction along the length. The state of the cell is then sensed by determining an electrical resistance between the electron input port and the electron output port. The cell is in a first state and has a high electrical resistance between the electron input port and the electron output port when the magnetization direction of the spin polarizing section is in the opposite direction along the length, such that electrons entering the polarized electron input port of the transport section all have spin directions in the opposite direction. The cell is in a second state and has a low electrical resistance between the electron input port and the electron output port when the magnetization direction of the spin polarizing section is in the first direction along the length, such that electrons entering the polarized electron input port of the transport section all have spin directions in the first direction.

Several embodiments of the spin polarized apparatus are disclosed including the formation of the spin polarizing section and the transport section in a single common layer, the formation of a multi-layer spin polarizing section and the formation of arrays of spin polarized cells by coupling the cells in rows with the electron output port of one cell connected to the electron input port of an adjacent cell.

BRIEF DESCRIPTION OF THE DRAWINGS

Referring to the drawings.

DESCRIPTION OF THE PREFERRED EMBODIMENTS

Figure 1:
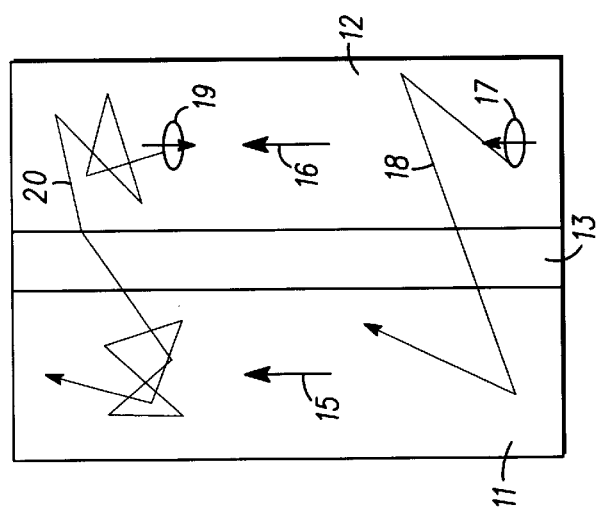
FIG. 1 illustrates a typical GMR cell with a first magnetic vector orientation and illustrating electron movement through the cell.
Figure 4:
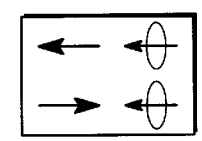

Turning now to FIG. 1, a typical GMR cell 10 is illustrated with a first magnetic vector orientation. Cell 10 includes a first magnetic layer 11 and a second magnetic layer 12 with a nonmagnetic layer 13 sandwiched therebetween. Typically, in a ferromagnetically coupled cell of this type, layer 13 is formed of some electrically conductive material, such as a thin layer of copper or the like. The magnetization direction of one or both of layers 11 and 12 may be changed during normal operation and, for purposes of this example, magnetic vectors 15 and 16 for layers 11 and 12, respectively, are illustrated as being both directed upwardly in FIG. 1.

During a sensing or reading operation, a sense current is applied to cell 10 which flows into layers 11, 12, and 13. Generally, electrons making up the sense current have spins which are directed along the magnetization axis of layers 11 and 12, but which will split with approximately one half of the spins being directed upwardly in FIG. 1 and the other one half being directed downwardly. Thus, assuming magnetic vectors 15 and 16 are in the illustrated directions, for an electron with an upwardly directed spin (represented at 17) entering cell 10, the path through cell 10 is almost a direct path, as represented by arrow 18. The resistance which an electron with an upwardly directed spin (represented at 17) sees is relatively small. However, for an electron entering cell 10 with a downwardly directed spin (represented at 19), the path through cell 10 is very random and circuitous, as represented by arrow 20. The resistance which an electron with a downwardly directed spin (represented at 19) sees is relatively large.

Figure 2:
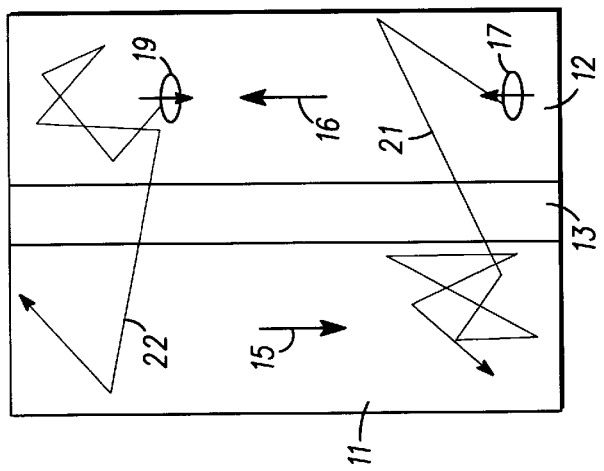
FIG. 2 is a view of the GMR cell of FIG. 1 with the magnetic vectors in a different orientation.

Turning now to FIG. 2, cell 10 is illustrated with the magnetization of layer 11 reversed so that magnetic vector 15 is reversed. Thus, assuming magnetic vectors 15 and 16 are in the illustrated directions, for an electron with an upwardly directed spin (represented at 17) entering cell 10, the path from layer 12 to layer 11 is almost a direct path, but the path through layer 11 is very random and circuitous, as represented by arrow 21. The resistance which an electron with an upwardly directed spin (represented at 17) sees is greater than the direct path (arrow 18 of FIG. 1) but less than the random, circuitous path represented by arrow 20 of FIG. 1. For an electron entering cell 10 with a downwardly directed spin (represented at 19), the path through layer 12 and out of cell 10 is very random and circuitous, but the path through layer 11 and out of cell 10 is generally direct, as represented by arrow 22. Again, the resistance which an electron with an upwardly directed spin (represented at 17) sees is greater than the direct path (arrow 18 of FIG. 1) but less than the random, circuitous path represented by arrow 20 of FIG. 1.

Figure 8:
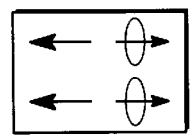
FIGS. 3–8 illustrate several possible relative positions of magnetic vectors and electron spins of the GMR cell of FIG. 1, with the examples being ordered in accordance with the resistance of the cell, from the lowest resistance in FIG. 3 to the highest resistance in FIG. 8.
Figure 7:
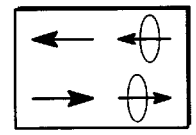
Figure 6:
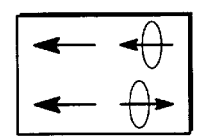
Figure 5:
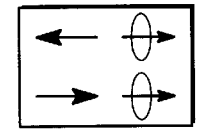
Figure 3:
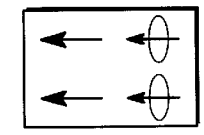

Referring to FIGS. 3–8, six different position combinations of magnetic vectors 15 and 16 and electron spins (represented by 17 and 19) are illustrated schematically for cell 10 of FIG. 1. The examples illustrated in FIGS. 3–8 are ordered in accordance with the resistance of the cell, from the lowest resistance in FIG. 3 to the highest resistance in FIG. 8. The orientation of vectors 15 and 16 and the electron spins is the same in FIG. 6 as in FIG. 1 and the orientation of vectors 15 and 16 and the electron spins is the same in FIG. 7 as in FIG. 2. In FIG. 3, both magnetic vectors 15 and 16 are directed upwardly and the electron spins are also directed upwardly. Thus, the electrons will travel a relatively straight path through cell 10 (generally similar to path 18 of FIG. 1) and the resistance will be a minimum. In FIG. 8, both magnetic vectors 15 and 16 are directed upwardly but the electron spins are both directed downwardly. Thus, the electrons will travel a very random and circuitous path through cell 10 (generally similar to path 20 of FIG. 1) and the resistance will be a maximum.

Figure 9:
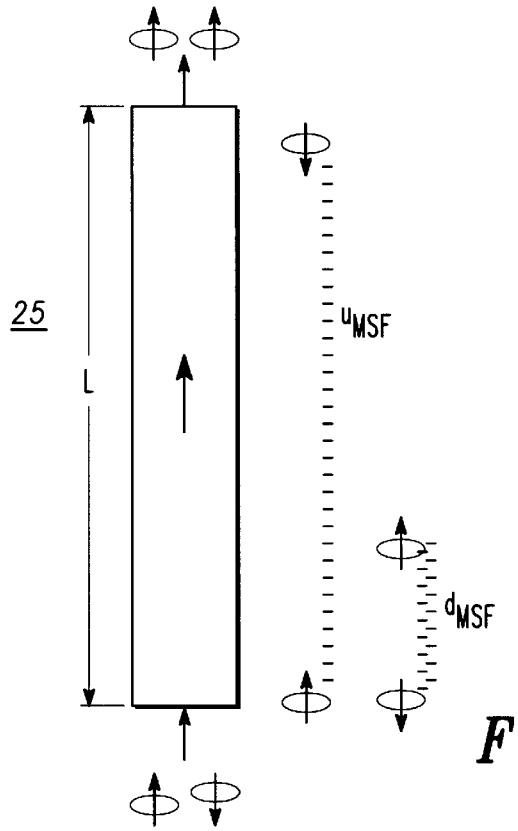
FIG. 9 is a schematic representation of a spin polarization section of magnetic material.

Referring specifically to FIG. 9, a spin polarizer 25 is illustrated. Spin polarizer 25 is formed of a generally rectangularly shaped layer of magnetic material with a length L. Generally, spin polarizer 25 has a width that is less than a width of magnetic domain walls within spin polarizer 25 so that a magnetic vector in spin polarizer 25 points substantially along the length of spin polarizer 25. Due to large differences in scattering rates for its majority spin direction (spin up, denoted with a "u" superscript) and its minority spin direction (spin down, denoted with a "d" superscript), a ferromagnetic material has four different length scales: the electron mean free paths for spin up ($^u\mu_e$) and spin down ($^d\mu_e$) electrons, and the spin flipping mean free paths for spin up electrons ($^u\mu_{sf}$) and spin down electrons ($^d\mu_{sf}$). Generally, $^u\mu_{sf} >> {^d\mu_{sf}} >> {^u\mu_e} >> {^d\mu_e}$. As a specific example, with spin polarizer 25 formed of NiFe:

$^u\mu_{sf}$ approximately equals 1.5 μm;

$^d\mu_{sf}$ approximately equals 750 Å;

$^u\mu_e$ approximately equals 200 Å; and $^d\mu_e$ approximately equals 10 Å.

The resistivity of spin down electrons is 20 times higher than that of spin up electrons. Since the spin flipping length or magnetic mean free path for spin down electrons ($^d\mu_{sf}$) is 20 times shorter than the magnetic mean free path for spin up electrons ($^u\mu_{sf}$), the ferromagnetic layer can be used for a spin polarizer. For example, if length L is adjusted so that $^u\mu_{sf} > L >> {^d\mu_{sf}}$, electrons passing lengthwise through spin polarizer 25 are substantially polarized. That is, electrons entering the lower end of spin polarizer 25 will be polarized so as to all have spin up directions at the upper end of spin polarizer 25. This polarization can be as high as 100%, but may be adjusted for different applications. Also, it will be understood that the four different length scales or mean free paths will vary for different magnetic materials so that while the above relationship will hold for the length of all materials, the actual length may vary.

Figure 10:
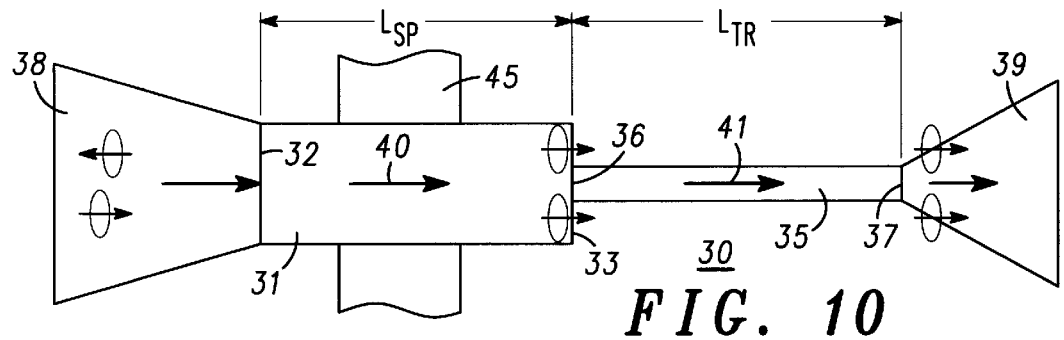
FIGS. 10 and 11 illustrate two different states of spin polarized apparatus in accordance with the present invention.
Figure 11:
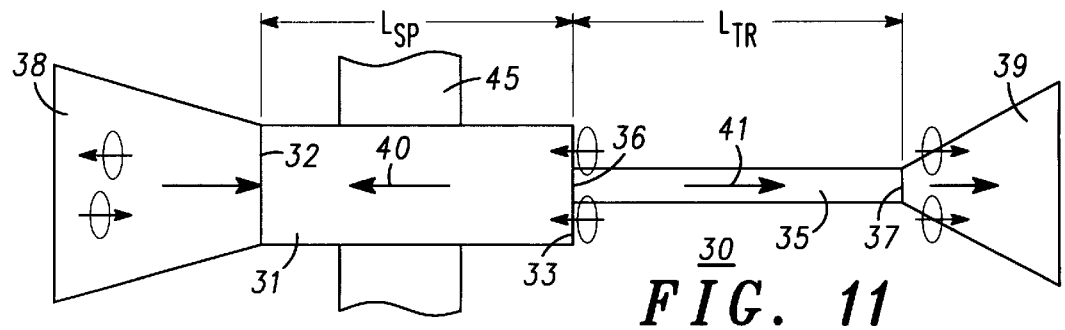

Turning now to FIGS. 10 and 11, spin polarized apparatus 30 in accordance with the present invention is illustrated. Apparatus 30 includes a spin polarizing section 31 constructed of magnetic material and having an electron input port 32 and a polarized electron port 33 spaced apart and defining a spin polarizing section length $L_{sp}$ therebetween. Apparatus 30 further includes a transport section 35 constructed of magnetic material and having a polarized electron input port 36 electrically coupled to polarized electron port 33 of spin polarizing section 31 and an electron output port 37 spaced apart and defining a transport section length $L_{tr}$ therebetween. Also, for purposes of explanation, apparatus 30 includes a nonmagnetic electrical contact 38 electrically connected to electron input port 32 and a nonmagnetic electrical contact 39 electrically connected to electron output port 37.

Spin polarizing section 31 is magnetized in a magnetization direction represented by a magnetic vector 40 and transport section 35 is magnetized in a direction represented by a magnetic vector 41. Also, in this example, spin polarizing section 31 is constructed such that the magnetization direction (vector 40) is easier to switch than the magnetization direction (vector 41) of transport section 35. To accomplish this switching characteristic, in this embodiment, spin polarizing section 31 has a larger cross sectional area than the cross sectional area of transport section 35, as can be seen in FIGS. 10 and 11. It should be understood that the different switching characteristics could alternatively be accomplished by forming spin polarizing section 31 and transport section 35 from different materials. As will be explained in more detail presently, the purpose of the different switching characteristics is to allow the switching of magnetic vector 40 without switching magnetic vector 41.

Spin polarizing section 31 is constructed, in accordance with the precepts described in conjunction with FIG. 9, such that electrons entering electron input port 32 exit through polarized electron port 33 all having similar spin directions. The spin directions of electrons at polarized electron port 33 are dependent upon the magnetization direction (magnetic vector 40) of spin polarizing section 31. For example, in FIG. 10 magnetic vector 40 is directed to the right and the spins of all electrons exiting through polarized electron port 33 are to the right. Also, transport section 35 is constructed, in accordance with the precepts described in conjunction with FIG. 9, such that electrons entering polarized electron input port 36 exit through electron output port 37 all having spin directions in the direction of magnetic vector 41. In this state, magnetic vector 41 of transport section 35 is directed to the right so that all of the polarized electrons entering polarized electron input port 36 do not switch directions and, consequently, travel a minimum path length, resulting in a minimum amount of electrical resistance (see FIG. 3) in apparatus 30 when it is in the state illustrated in FIG. 10.

Referring specifically to FIG. 11, magnetic vector 40 of spin polarizing section 31 is switched to the opposite direction from that of FIG. 10. Vector 41 of transport section 35, however, remains in the same direction, i.e. pointing to the right. In this state, all of the electrons exiting polarized electron port 33 are to the left, or in the direction of magnetic vector 40. In this state, magnetic vector 41 of transport section 35 is still directed to the right so that all of the polarized electrons entering polarized electron input port 36 must switch directions and, consequently, travel a maximum path length, resulting in a maximum amount of electrical resistance (see FIG. 8) in apparatus 30 when it is in the state illustrated in FIG. 11.

Generally, since the spins of electrons entering electron input port 32 will be approximately one half in each direction (left and right), the electrical resistance of spin polarizing section 31 will be substantially constant. However, the electrical resistance of transport section 35 will switch between a minimum and a maximum amount. Thus, the GMR ratio for spin polarized apparatus 30 will be larger than it is for nonpolarized magnetic cells. Also, it should be noted that in this specific embodiment spin polarizing section 31 and transport section 35 are formed in a single, common layer of material which greatly simplifies manufacturing. Further, writing in apparatus 30 is accomplished by, for example, a combination of currents applied to a write line 45 and between contacts 38 and 39. Since only magnetic vector 40 in the single layer defining spin polarizing section 31 is switched to change states, the required writing current is generally smaller than writing current for multi-layer memory cells.

Figure 12:
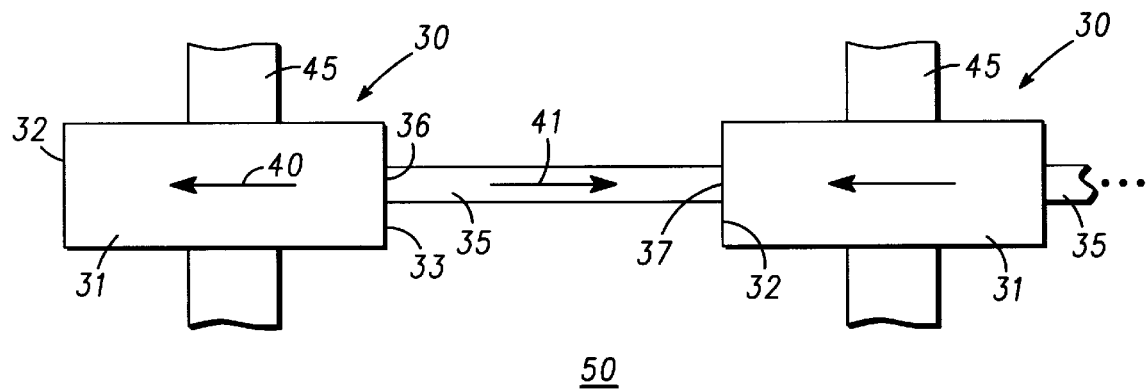
FIG. 12 illustrates another embodiment of spin polarized apparatus in accordance with the present invention.

Referring specifically to FIG. 12, another embodiment of spin polarized apparatus 50 in accordance with the present invention is illustrated. Apparatus 50 includes an array of devices similar to spin polarized apparatus 30 of FIG. 10 (without electrical contacts 38 and 39) with similar components being designated with similar numbers for better understanding of the connections. Spin polarized apparatus 30 are electrically connected into rows of devices with electron output port 37 of one cell being electrically coupled to electron input port 32 of a next adjacent cell in a row to form each row of cells into a sense line. Also, a plurality of word lines 45 extend generally perpendicular to the rows, with each word line 45 of the plurality of word lines being positioned adjacent an associated cell 30 in each row. Word lines 45 are positioned to produce a magnetic field adjacent spin polarizing section 31 of associated cell 30 for switching the magnetization direction of spin polarizing section 31 of the associated cell 30 between a first direction along the length and an opposite direction along the length. As will be understood, each cell is addressed by means of a combination of a selected word line 45 and sense line. In some applications another line (e.g. a digital line) may be positioned to parallel the sense lines and may carry a portion of the writing current, rather than the sense line.

Figure 13:
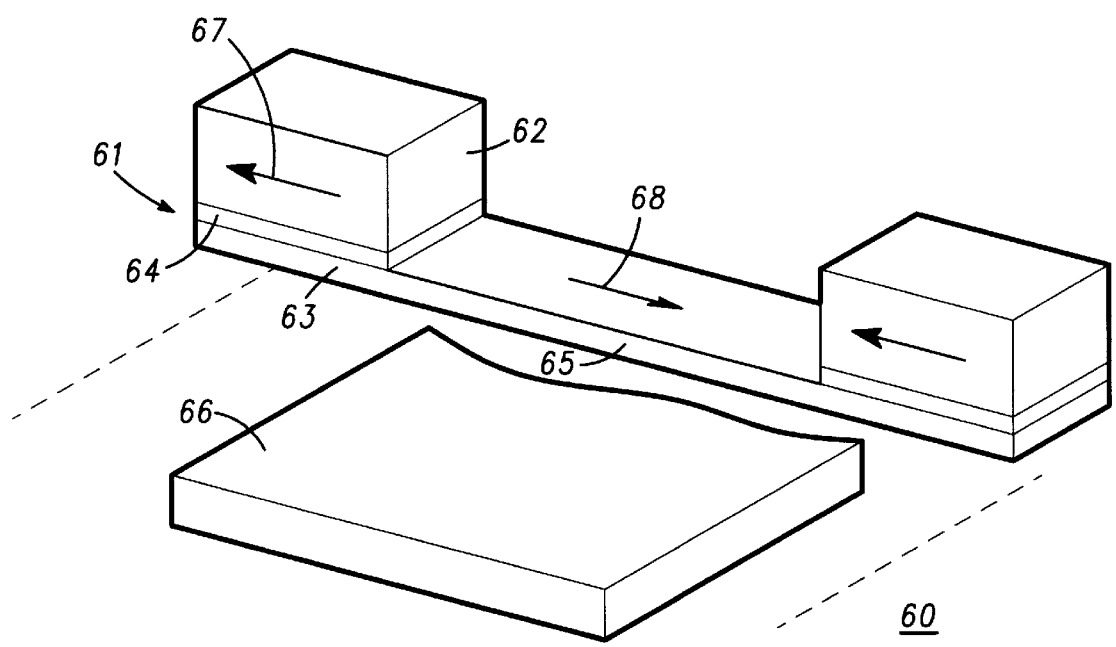
FIG. 13 illustrates still another embodiment of spin polarized apparatus in accordance with the present invention.

Referring specifically to FIG. 13, another embodiment of spin polarizing apparatus, designated 60, is illustrated. In this embodiment, a spin polarizing section 61 includes a magnetic layer 62 positioned in overlying relationship to a magnetic layer 63 and separated by a nonmagnetic layer 64 sandwiched therebetween. In this embodiment, a transport section 65 is formed integrally with magnetic layer 63 of spin polarizing section 61. The single, common magnetic layer of material defining magnetic layer 63 and transport section 65 continues in both directions to form a sense line and additional memory cells in an array of memory cells. The array includes additional rows of sense lines, not illustrated for better understanding of the figure. Also, a plurality of lines 66 extend generally perpendicular to the rows to form word lines.

In the specific embodiment illustrated in FIG. 13, layer 65 is much thinner than layer 62 and the magnetization direction (represented by a magnetic vector 68) can be easily switched to be either parallel or antiparallel to the magnetization direction (represented by magnetic vector 67) of layer 62. In one variation of this embodiment, magnetic layers 62 and 63 are ferromagnetically coupled and layer 64 is a thin layer of electrically conductive material. The operation of this embodiment is similar to the description associated with FIGS. 1 and 2 except that either of magnetic layers 62 and 63 are designed to operate as a spin polarizer and either layer 65 alone or layer 65 in conjunction with layer 63 are designed as the transport section. Also, in another variation, magnetic layers 62 and 63 are antiferromagnetically coupled and layer 64 is a thin layer of electrically insulative material.

Accordingly, new and improved spin polarized apparatus are disclosed which produces a larger change (GMR ratio) between states and which utilizes less sensing and writing current. Also, the new and improved spin polarized apparatus are simpler to manufacture and to use. The spin polarized apparatus is incorporated into a new and improved multi-state, magnetic memory cell in which it is faster and simpler to sense stored states and to write or store states. Further, the new and improved magnetic memory cells are included in an array of improved spin polarized memory cells.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. Spin polarized apparatus comprising:

a spin polarizing section of magnetic material with an electron input port and a polarized electron port spaced apart and defining a spin polarizing section length therebetween, the spin polarizing section being magnetized in a magnetization direction and constructed such that electrons entering the electron input port exit through the polarized electron port all having similar spin directions dependent upon the magnetization direction of the spin polarizing section;

a transport section of magnetic material with a polarized electron input port electrically coupled to the polarized electron port of the spin polarizing section and an electron output port spaced apart and defining a transport section length therebetween, the transport section being magnetized in a first direction and the transport section being constructed such that electrons entering the polarized electron input port exit through the electron output port all having spin directions in the first direction.

2. Spin polarized apparatus as claimed in claim 1 wherein the spin polarizing section is constructed such that the magnetization direction is easier to switch than the magnetization direction of the transport section.

3. Spin polarized apparatus as claimed in claim 2 wherein the spin polarizing section has a larger cross sectional area than a cross sectional area of the transport section.

4. Spin polarized apparatus as claimed in claim 1 including in addition, a first non-magnetic electrical contact connected to the electron input port of the spin polarizing section and a second non-magnetic electrical contact connected to the electron output port of the transport section.

5. Spin polarized apparatus as claimed in claim 1 including in addition means for producing a magnetic field adjacent the spin polarizing section for switching the magnetization direction of the spin polarizing section between a first direction along the length and an opposite direction along the length.

6. Spin polarized apparatus as claimed in claim 5 wherein the apparatus has a high electrical resistance between the electron input port and the electron output port when the magnetization direction of the spin polarizing section is in the opposite direction along the length such that electrons entering the polarized electron input port of the transport section all have spin directions in the opposite direction and the apparatus has a low electrical resistance between the electron input port and the electron output port when the magnetization direction of the spin polarizing section is in the first direction along the length such that electrons entering the polarized electron input port of the transport section all have spin directions in the first direction.

7. Spin polarized apparatus as claimed in claim 1 wherein the spin polarizing section and the transport section are formed in a single layer of magnetic material.

8. Spin polarized apparatus as claimed in claim 1 wherein the spin polarizing section includes a first magnetic layer and a second magnetic layer positioned in overlying relationship to the first magnetic layer and separated by a nonmagnetic layer sandwiched therebetween, and the transport section is formed integrally with the first magnetic layer of the spin polarizing section.

9. Spin polarized apparatus as claimed in claim 8 wherein the first and second magnetic layers are ferromagnetically coupled.

10. Spin polarized apparatus as claimed in claim 8 wherein the first and second magnetic layers are antiferromagnetically coupled.

11. Spin polarized apparatus as claimed in claim 8 wherein the electron input port of the spin polarizing section is included in the first magnetic layer.

12. Spin polarized apparatus comprising:

a spin polarizing section of magnetic material with an electron input port and a polarized electron port spaced apart along an axial dimension of the spin polarizing section and defining a spin polarizing section length therebetween, the spin polarizing section being magnetized in a magnetization direction and having a width that is less than a width of magnetic domain walls within the spin polarizing section so that a magnetic vector in the spin polarizing section points substantially along the length of the spin polarizing section, the magnetization direction of the spin polarizing section being switchable between a first direction along the length and an opposite direction along the length, and the length of the spin polarizing section being such that electrons entering the electron input port exit through the polarized electron port all having similar spin directions dependent upon the direction of magnetization of the spin polarizing section;

a transport section of magnetic material with a polarized electron input port electrically coupled to the polarized electron port of the spin polarizing section and an electron output port spaced apart along an axial dimension of the transport section and defining a transport section length therebetween, the transport section being magnetized in a first direction and having a width that is less than a width of magnetic domain walls within the transport section so that a magnetic vector in the transport section points substantially along the length of the transport section, and the length of the transport section being such that electrons entering the polarized electron input port exit through the electron output port all having spin directions in the first direction.

13. Spin polarized apparatus as claimed in claim 12 wherein the spin polarizing section is constructed such that the magnetization direction is easier to switch than the magnetization direction of the transport section.

14. Spin polarized apparatus as claimed in claim 13 wherein the spin polarizing section has a larger cross sectional area than a cross sectional area of the transport section.

15. Spin polarized apparatus as claimed in claim 12 including in addition, a first non-magnetic electrical contact connected to the electron input port of the spin polarizing section and a second non-magnetic electrical contact connected to the electron output port of the transport section.

16. Spin polarized apparatus as claimed in claim 12 including in addition means for producing a magnetic field adjacent the spin polarizing section for switching the magnetization direction of the spin polarizing section between a first direction along the length and an opposite direction along the length.

17. Spin polarized apparatus as claimed in claim 16 wherein the apparatus has a high electrical resistance between the electron input port and the electron output port when the magnetization direction of the spin polarizing section is in the opposite direction along the length such that electrons entering the polarized electron input port of the transport section all have spin directions in the opposite direction and the apparatus has a low electrical resistance between the electron input port and the electron output port when the magnetization direction of the spin polarizing section is in the first direction along the length such that electrons entering the polarized electron input port of the transport section all have spin directions in the first direction.

18. Spin polarized apparatus as claimed in claim 12 wherein the spin polarizing section and the transport section are formed in a single layer of magnetic material.

19. Spin polarized apparatus as claimed in claim 12 wherein the spin polarizing section includes a first magnetic layer and a second magnetic layer positioned in overlying relationship to the first magnetic layer and separated by a nonmagnetic layer sandwiched therebetween, and the transport section is formed integrally with the first magnetic layer of the spin polarizing section.

20. Spin polarized apparatus as claimed in claim 19 wherein the first and second magnetic layers are ferromagnetically coupled.

21. Spin polarized apparatus as claimed in claim 19 wherein the first and second magnetic layers are antiferromagnetically coupled.

22. Spin polarized apparatus as claimed in claim 19 wherein the electron input port of the spin polarizing section is included in the first magnetic layer.

23. Spin polarized apparatus comprising:

an array of spin polarized cells, each cell including
a spin polarizing section of magnetic material with an electron input port and a polarized electron port spaced apart along an axial dimension of the spin polarizing section and defining a spin polarizing section length therebetween, the spin polarizing section being magnetized in a magnetization direction and constructed such that electrons entering the electron input port exit through the polarized electron port all having similar spin directions dependent upon the magnetization direction of the spin polarizing section, and
a transport section of magnetic material with a polarized electron input port electrically coupled to the polarized electron port of the spin polarizing section and an electron output port spaced apart along an axial dimension of the transport section and defining a transport section length therebetween, the transport section being magnetized in a first direction and the transport section being constructed such that electrons entering the polarized electron input port exit through the electron output port all having spin directions in the first direction; and
the array of spin polarized cells being electrically connected in rows with the electron output port of one cell being electrically coupled to the electron input port of a next adjacent cell in a row to form each row of cells into a sense line.

24. Spin polarized apparatus as claimed in claim 23 including in addition a plurality of word lines extending generally perpendicular to the rows, each word line of the plurality of word lines being positioned adjacent an associated cell in each row for producing a magnetic field adjacent the spin polarizing section of the associated cell for switching the magnetization direction of the spin polarizing section of the associated cell between a first direction along the length and an opposite direction along the length.

25. Spin polarized apparatus as claimed in claim 23 wherein the spin polarizing section and the transport section of each cell in the array of spin polarized cells are formed in a single layer of magnetic material.

26. Spin polarized apparatus as claimed in claim 23 wherein the spin polarizing section includes a first magnetic layer and a second magnetic layer positioned in overlying relationship to the first magnetic layer and separated by a nonmagnetic layer sandwiched therebetween, and the transport section is formed integrally with the first magnetic layer of the spin polarizing section.

27. Spin polarized apparatus as claimed in claim 26 wherein the first and second magnetic layers are ferromagnetically coupled.

28. Spin polarized apparatus as claimed in claim 26 wherein the first and second magnetic layers are antiferromagnetically coupled.

29. Spin polarized apparatus as claimed in claim 26 wherein the electron input port of the spin polarizing section is included in the first magnetic layer.

30. A method of fabricating spin polarized apparatus comprising the steps of:

forming a spin polarizing section of magnetic material with an electron input port and a polarized electron port spaced apart and defining a spin polarizing section length therebetween, magnetizing the spin polarizing section in a magnetization direction and constructing the spin polarizing section such that electrons entering the electron input port exit through the polarized electron port all having similar spin directions dependent upon the magnetization direction of the spin polarizing section;

forming a transport section of magnetic material with a polarized electron input port and an electron output port, electrically coupling the polarized electron input port of the transport section to the polarized electron port of the spin polarizing section, magnetizing the transport section in a first direction and constructing the transport section such that electrons entering the polarized electron input port exit through the electron output port all having spin directions in the first direction.

31. A method of fabricating spin polarized apparatus as claimed in claim 30 wherein the steps of forming the spin polarizing section of magnetic material and forming the transport section of magnetic material are performed on a single, common layer of magnetic material.

32. A method of fabricating spin polarized apparatus as claimed in claim 30 wherein the step of forming the spin polarizing section of magnetic material includes the steps of forming a first magnetic layer, positioning a nonmagnetic layer on the first magnetic layer and positioning a second magnetic layer in overlying relationship to the first magnetic layer on the nonmagnetic layer, and the transport section is formed integrally with the first magnetic layer of the spin polarizing section.

33. A method of fabricating spin polarized apparatus as claimed in claim 32 wherein the steps of forming the first magnetic layer and forming the transport section of magnetic material are performed on a single common layer of material.

34. A method of fabricating spin polarized apparatus as claimed in claim 32 wherein the steps of forming the first magnetic layer, positioning the nonmagnetic layer on the first magnetic layer and positioning the second magnetic layer in overlying relationship to the first magnetic layer on the nonmagnetic layer are performed so that the first and second magnetic layers are ferromagnetically coupled.

35. A method of fabricating spin polarized apparatus as claimed in claim 32 wherein the steps of forming the first magnetic layer, positioning the nonmagnetic layer on the first magnetic layer and positioning the second magnetic layer in overlying relationship to the first magnetic layer on the nonmagnetic layer are performed so that the first and second magnetic layers are antiferromagnetically coupled.

36. A method of operating spin polarized apparatus comprising the steps of:

providing a spin polarized cell including: a spin polarizing section of magnetic material with an electron input port and a polarized electron port spaced apart and defining a spin polarizing section length therebetween, the spin polarizing section being magnetized in a magnetization direction and constructed such that electrons entering the electron input port exit through the polarized electron port all having similar spin directions dependent upon the magnetization direction of the spin polarizing section; a transport section of magnetic material with a polarized electron input port electrically coupled to the polarized electron port of the spin polarizing section and an electron output port spaced apart and defining a transport section length therebetween, the transport section being magnetized in a first direction and the transport section being constructed such that electrons entering the polarized electron input port exit through the electron output port all having spin directions in the first direction; and a word lines positioned adjacent to the spin polarizing section for producing a magnetic field adjacent the spin polarizing section of the associated cell;

writing the cell by energizing the word line to switch the magnetization direction of the spin polarizing section between a first direction along the length and an opposite direction along the length; and sensing a state of the cell by determining an electrical resistance between the electron input port and the electron output port, the cell being in a first state and having a high electrical resistance between the electron input port and the electron output port when the magnetization direction of the spin polarizing section is in the opposite direction along the length such that electrons entering the polarized electron input port of the transport section all have spin directions in the opposite direction, and the cell being in a second state and having a low electrical resistance between the electron input port and the electron output port when the magnetization direction of the spin polarizing section is in the first direction along the length such that electrons entering the polarized electron input port of the transport section all have spin directions in the first direction.

\* \* \* \* \*